(12) United States Patent
Monsma et al.

(10) Patent No.: US 6,269,018 B1
(45) Date of Patent: Jul. 31, 2001

(54) MAGNETIC RANDOM ACCESS MEMORY USING CURRENT THROUGH MTJ WRITE MECHANISM

(75) Inventors: Douwe Johannes Monsma, Palo Alto; Stuart Stephen Papworth Parkin, San Jose; Roy Edwin Scheuerlein, Cupertino, all of CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/549,171

(22) Filed: Apr. 13, 2000

(51) Int. Cl.$^7$ .......................... G11C 11/22; G11C 11/15
(52) U.S. Cl. ............................ 365/145; 365/173
(58) Field of Search ..................... 365/145, 171, 365/172, 173, 158

(56) References Cited

U.S. PATENT DOCUMENTS

| | | | |
|---|---|---|---|
| 5,541,868 | 7/1996 | Prinz | 365/98 |
| 5,640,343 | 6/1997 | Gallagher et al. | 365/171 |
| 5,695,864 | 12/1997 | Slonczewski | 428/212 |
| 5,734,605 | 3/1998 | Zhu et al. | 365/173 |
| 5,764,567 * | 6/1998 | Parkin | 365/173 |
| 5,793,697 * | 8/1998 | Scheuerlein | 365/365 |
| 5,801,984 * | 9/1998 | Parkin | 365/158 |
| 5,841,692 * | 11/1998 | Gallagher et al. | 365/173 |
| 6,072,718 * | 6/2000 | Abraham et al. | 365/173 |
| 6,114,719 * | 9/2000 | Dill et al. | 257/295 |
| 6,130,835 * | 10/2000 | Scheuerlein | 365/171 |

* cited by examiner

Primary Examiner—Vu A. Le
Assistant Examiner—Anh Phung
(74) Attorney, Agent, or Firm—Thomas R. Berthold, Esq.; Banner & Witcoff, Ltd.

(57) ABSTRACT

A non-volatile memory array includes a plurality of memory cells. Each memory cell includes a magnetic tunnel junction device having a first free ferromagnetic layer, a second free ferromagnetic layer and a highly conductive layer. The first ferromagnetic layer of each magnetic tunnel junction device extends in a direction that is substantially parallel to the second ferromagnetic layer of the magnetic tunnel junction device. The highly conductive layer of each magnetic tunnel junction device is formed between the first ferromagnetic layer and the second ferromagnetic layer of the magnetic tunnel junction device. A write current through each selected memory cell flows into the highly conductive layer and along at least a portion of the highly conductive layer. A self-field associated with the write current changes a first predetermined magnetization of the first and second ferromagnetic layers to a second predetermined magnetization. In a second embodiment, each memory cell includes a magnetic tunnel junction device having a first free ferromagnetic layer, a second pinned ferromagnetic layer, and a tunneling barrier layer formed between the first and second ferromagnetic layers. The first free ferromagnetic layer has a magnetization in a form of a vortex. The second pinned ferromagnetic layer has substantially the same shape as the shape of the first free ferromagnetic layer and a magnetization in a form of a vortex. A write current flows through the memory cell and producing a self-field that changes a magnetic vortex state of the first free ferromagnetic layer from a first predetermined handedness to a second predetermined handedness.

35 Claims, 14 Drawing Sheets

MAGNETIC RANDOM ACCESS MEMORY USING CURRENT THROUGH MTJ WRITE MECHANISM

CROSS REFERENCE TO RELATED APPLICATIONS

The present application is related to U.S. patent application Ser. No. 09/549,172, entitled "Magnetic Random Access Memory Using A Series Tunnel Element Select Mechanism," invented by D. J. Monsma et al., and U.S. patent application Ser. No. 09/549,212, entitled "Magnetic Random Access Memory Using A Non-Linear Memory Element Selection Mechanism," invented by D. J. Monsma et al., both of which were filed concurrently with the present application, and each of which is incorporated by reference herein.

BACKGROUND OF THE INVENTION

1. Field of the Invention

The present invention relates generally to the field of nonvolatile memory devices for use in computers and other devices. More particularly, the present invention relates to nonvolatile memory arrays that use magnetic tunnel junction memory elements as individual memory cells.

2. Description of the Related Art

Certain types of magnetic memory cells that use the magnetic state of a ferromagnetic (FM) region for altering the electrical resistance of materials located near the ferromagnetic region are collectively known as magnetoresistive (MR) memory cells. An array of magnetic memory cells is often called a magnetic random access memory (MRAM).

In comparison to metallic MR memory cells, which are based on giant magnetoresistance (GMR) or anisotropic magnetoresistance (AMR) devices, MRAM memory cells are based on magnetic tunnel junction (MTJ) devices and rely on substantially different physical principles. For example, GMR devices include at least two ferromagnetic layers that are separated by a thin metallic layer. In contrast, an MTJ device has two ferromagnetic layers that are separated by a thin insulating tunnel barrier. The magnetoresistance of an MTJ device results from a spin-polarized tunneling of conduction electrons between the two ferromagnetic layers that depends on the relative orientation of the magnetic moments of the two ferromagnetic layers. Another important distinction between GMR and MTJ devices is that current flows parallel to the thin film layers forming a GMR device, whereas current flows perpendicularly to the thin film layers forming an MTJ device.

It is possible to form GMR memory cells in which the current passes perpendicularly to the thin film layers forming the GMR device for reading and possibly writing the cell. In such a device, the magnetic moment of the free layer can be rotated or can be aided to rotate by the self-field of the current flowing through the device itself. See, for example, J. M. Daughton, Magnetoresistive memory technology, Thin Solid Films 216, 162, 1992. By using current passing through the GMR memory cell, in addition to currents passing through word and/or bit line, the magnetic switching of a selected GMR cell in a GMR memory cell array is improved. Such a memory cell, however, unless extremely small, will have such a low resistance that there will be extremely little signal available for reading the device without a correspondingly high read current.

U.S. Pat. No. 5,695,864 to J. Slonczewski discloses a physical mechanism for switching the magnetization of FM layers by passing a current through a GMR or an MTJ element. According to Slonczewski, electrical transport of spins exerts a magnetic force on the magnetic moment of the film, thereby making rotation of the magnetic moment, in theory, possible. This effect has recently been demonstrated in exotically prepared tiny metallic GMR devices by J. A. Katine et al., Current-driven magnetization reversal and spin wave excitation in Co/Cu/Co pillars, Phys. Rev. Lett. (to be published in 2000), and in very narrow metallic GMR wires formed by electro-deposition in etched ion beam tracks in polymer membranes by J. E. Wegrowe et al., Euro. Phys. Lett. 45,626 (1999). Nevertheless, this effect has not been demonstrated in MTJs because the current densities must be much higher than are presently provided in MTJs.

MRAM designs have also been disclosed having various read select mechanisms. For example, U.S. Pat. No. 5,734,605 to Zhu et al. discloses a read select mechanism that uses a transistor for each cell. U.S. Pat. No. 5,640,343 to Gallagher et al. discloses a read select mechanism that uses a series diode for each cell. U.S. patent application Ser. No. 09/549,172, relates to a read select mechanism that uses a series non-linear tunnel junction for each cell, and U.S. patent application Ser. No. 09/549,212, relates to a read select mechanism that uses the intrinsic non-linearity of the MTJ itself.

U.S. Pat. No. 5,734,605 to Zhu et al. and U.S. Pat. No. 5,640,343 to Gallagher et al. both disclose that writing is performed by a cross-selection geometry in which a vector sum of the fields generated by write currents flowing in two orthogonal bit and word lines switches the magnetization of a selected cell located at the cross point of the bit and word lines. The vector sum of the field at the cross point is $\sqrt{2}$ larger than the field generated by the bit or word line alone, which provides a way for selecting an individual magnetic cell.

FIG. 1A shows an MRAM array formed from magnetic tunneling junction (MTJ) memory cells, such as disclosed in U.S. Pat. No 5,640,343. The array includes a first set of substantially parallel electrically conductive lines that function as parallel word lines 1–3 and a second set of substantially parallel electrically conductive lines that function as parallel bit lines 4–6. Word lines 1–3 are formed in a first horizontal plane and bit lines 4–6 are formed in a second horizontal plane. Bit lines 4–6 are oriented in a direction that is generally perpendicular to word lines 1–3. Bit lines 4–6 are preferably oriented at right angles from word lines 1–3, so that the two sets of lines appear to intersect, or overlap, when viewed from above. A plurality of intersection regions is defined between the plurality of overlaps of the two sets of lines. An MTJ memory cell 9 is located at each intersection region between the intersecting lines. While only three word lines and six bit lines are shown in FIG. 1A, the number of word and bit lines would typically be much larger.

MTJ memory cell 9 is arranged in a vertical stack and includes a selection device 7, such as a silicon junction diode, and an MTJ device 8. Selection device 7 includes an n-type silicon layer 10 and a p-type silicon layer 11. Layer 10 is connected to word line 3. Layer 11 is connected to MTJ element 8 via a tungsten stud 12.

MTJ device 8 is formed from a series of layers of material stacked one on top of the other. A template layer 13, such as Pt, is formed on stud 12. An initial ferromagnetic layer 14, such as permalloy (Ni—Fe), is formed on template layer 13. An antiferromagnetic layer (AF) 15, such as Mn—Fe, is formed on layer 14. A fixed ferromagnetic layer (FMF) 16, such as Co—Fe or permalloy, is formed on layer 15. A thin tunneling barrier layer 17 of alumina (Al$_2$O$_3$) is formed on layer 16. A soft ferromagnetic layer (FMS) 18, such as a sandwich of thin Co—Fe with permalloy, is formed on layer 17. Lastly, a contact layer 19, such as Pt, is formed on layer 18.

To read the state of a selected MTJ memory cell in the array of FIG. 1A, a current is passed through the MTJ memory cell. Various methods have been proposed to allow for read selection of a particular memory cell. For example, U.S. Pat. No. 5,640,343 to Gallagher et al. discloses that a field effect transistor 21 can be used in series with each MTJ device 22, such as shown in FIG. 2A. Gallagher et al. disclose that alternatively a diode 23 can be used in series with each MTJ device 22, such as shown in FIG. 2B. U.S. patent application Ser. No. 09/549,172, discloses that a non-magnetic tunnel junction 24 can be used in series with each MTJ 22, such as shown in FIG. 2C. U.S. patent application Ser. No. 09/549,212, discloses that a strongly non-linear MTJ device 25 alone can be used, such as shown in FIG. 2D.

Conventionally, the writing of a MTJ cell in an MTJ-MRAM array is performed by sending currents through the corresponding word and bit lines of the selected MTJ cell. Two independent currents are passed through the array along the word and bit lines. Unlike the read process, no current is designed to flow through the selected cell. A conventional writing process is depicted in each of FIGS. 2A–2D where the current paths through the array for writing a selected MTJ cell are represented by a heavy word line WI and a heavy bit line B1.

Typical MRAM memory cells do not have identical switching fields. The switching fields differ from cell to cell based on variations in memory cell shape and size, variations in thickness of the thin film layers forming each memory cell, damage to a cell introduced during fabrication, and/or different magnetic histories to which the magnetic device forming the respective cells have been subjected. Consequently, there is likely to be some variation in the switching fields of the magnetic devices in a memory array. The variations may be so large that it becomes difficult to write a selected cell without affecting the state of half-selected cells, that is, the cells along the word and bit lines of the selected cell. This problem is likely to become more severe as the size of the memory cells decreases and there is a consequent larger relative variation in shape and size of the memory cells.

The field obtained at the cross point of the selected word and bit lines is the vector sum of the self-field of the respective currents passed through the word and bit lines, which is only about $\sqrt{2}$ times larger than the field obtained solely from either of the bit or write line currents. More importantly, the field used for switching the selected MTJ device at the cross-point is only about 40% larger than the field to which the half-selected devices are subjected. Thus, the margin for write selectivity is small, and is reduced by any variation in switching fields of the individual MTJ devices within a given memory array.

The switching field of an MTJ device is sensitive to, for example, the exact shape and roughness of the edges of the MTJ device. The switching field is also influenced by the thickness of both of the ferromagnetic electrodes, as well as the thickness of the tunnel junction. The field may also be influenced by the processing used to form the MTJ device. For example, some of the magnetic material removed during the patterning of an MTJ device may be re-deposited within the MTJ array. For these reasons, it is extremely difficult to prepare arrays of magnetic memory cells having extremely homogeneous magnetic switching fields. Nevertheless, unless the MTJ devices of an array can be formed to have homogeneous magnetic switching fields, MTJ devices other than the selected device may switch during the writing of the selected cross-point memory cell, especially the MTJ cells located along the selected bit and write lines.

In view of the foregoing, what is needed is a way for improving the write selectivity of individual MTJ memory cells in an MRAM array over the write selectivity obtained by a vector combination of the self-fields of currents passing through orthogonal word and bit lines.

SUMMARY OF THE INVENTION

The present invention provides a way for improving the write selectivity of individual MTJ memory cells in an MRAM array over the write selectivity obtained by a vector combination of the self-fields of currents passing through orthogonal word and bit lines.

The advantages of the present invention are provided by an MRAM having memory cells formed from magnetic tunnel junction (MTJ) devices. Each memory cell includes a magnetoresistive MTJ element in series with a selection device (SD), such as a field effect transistor (FET) or a non-linear element (NLE). Exemplary non-linear elements include a metal-insulator-metal (MIM) device and a metal-semiconductor-metal (MSM) junction device. The present invention uses the self-field of a current passing through the MTJ device to write, or assist in writing, the MTJ cell. The selection devices are used for passing current through only the selected MTJ devices. while the most useful selection device for the present invention allow bi-directional current flow through an MTJ device, a diode selection device that only allows uni-directional current flow is also useful.

In a first embodiment of the present invention, current is injected at an edge of an MTJ device. The current then spreads through one of the electrodes of the MTJ device before flowing perpendicularly through the tunnel junction. The spreading current produces magnetic field vectors that are in the plane of the free layer and allow switching of the magnetic state, assisted or unassisted by word/bit line fields. An additional feature provided by the present invention is that the edge-injected spreading current may flow between two flux-closed magnetic layers or into a non-magnetic core of an elongated ferromagnetic toroid. In an alternative configuration of the first embodiment, a meandering current is utilized either at the upper layer, the lower layer or both layers, thereby magnifying the total field and permitting easier switching.

In a second embodiment of the present invention, current is passed through an MTJ device that is formed in the shape of a disk. The properties of the disk are chosen such that the magnetization in each of the ferromagnetic layers forming the MTJ form a magnetization vortex that is either right-handed or left-handed. Because the magnetization is in the form of a vortex, interaction between neighboring MTJ devices is reduced. The state of the MTJ device is written by passing current through the MTJ device so that the MTJ device favors one or the other handedness of the vortex state so that the vortex state in one of the FM layers of the MTJ device is set. An additional current from an adjacent word or bit line may be used for reducing the current through the MTJ needed for setting the magnetic state of the MTJ.

BRIEF DESCRIPTION OF THE DRAWING

The present invention is illustrated by way of example and not limitation in the accompanying figures in which like reference numerals indicate similar elements and in which.

DETAILED DESCRIPTION

The present invention provides an improved write selectivity for individual MTJ memory cells forming an MRAM array by passing a current through each selected MTJ cell for writing, or for aiding the writing, of the selected MTJ cell. The manner in which an MTJ cell is selected significantly decreases disturbance of unselected cells, and thereby improves the write select margin of the selected MTJ cell. As a result, a larger spread or variation in switching fields of the MTJ devices is permitted in an MRAM array. When the MTJ cell forms a completely flux-closed structure, the switching field that is required for changing the state of the MTJ cell is reduced accordingly because no demagnetization fields affect the MTJ cell. Moreover, the magnetic disturbance experienced by neighboring MTJ cells of the flux-closed MTJ cell is similarly reduced. Additionally, the present invention provides higher switching speeds due to a larger switch field/coercive field ratio and a smaller write power because the write currents flow closer to the switch layers and the switching fields associated with a flux-closed structure are lower.

The selection device in series with a selected MTJ cell is used for passing a current through the MTJ cell during the writing process in the same way that the selection device is used to pass a current through only the MTJ cell during a reading process. FIGS. 3A–3D depict writing processes according to the present invention that respectively correspond to each of the MTJ/selection device configurations shown in FIGS. 2A–2D. The heavy lines shown in FIGS. 3A–3D represent the current path through a particular MTJ device and its associated series selection device. The write current path is the same current path used for reading the MTJ device.

Figures 1A, 1B:
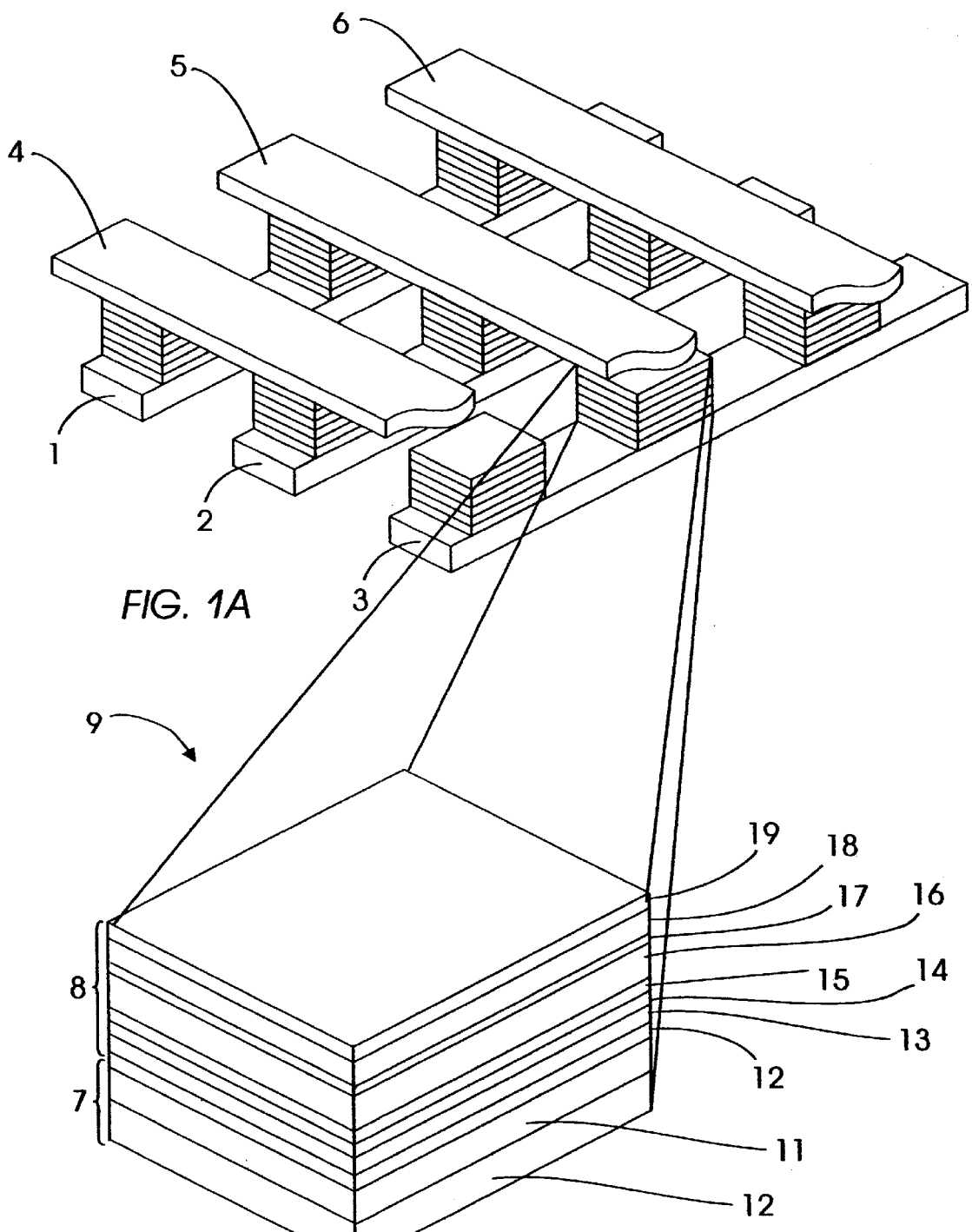
FIG. 1A shows a conventional MRAM having magnetic memory cells located between crossing points of bit and word lines.
FIG. 1B shows an enlarged view of a conventional memory cell of the FIG. 1A.
Figure 2A:
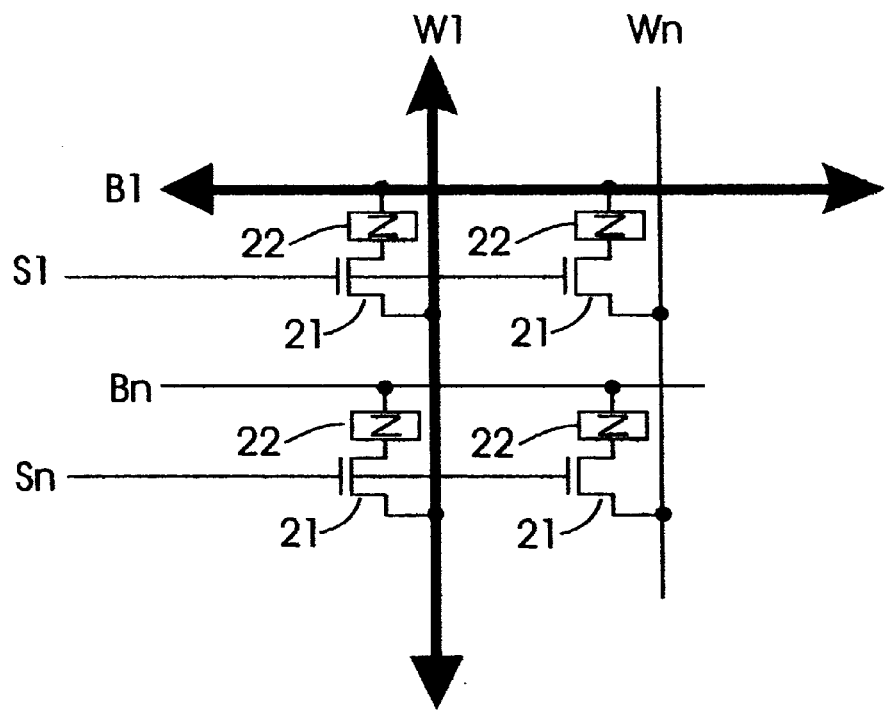
FIG. 2A is a schematic block diagram depicting a write operation for a conventional MRAM having an MTJ-FET combination per cell.
Figure 2B:
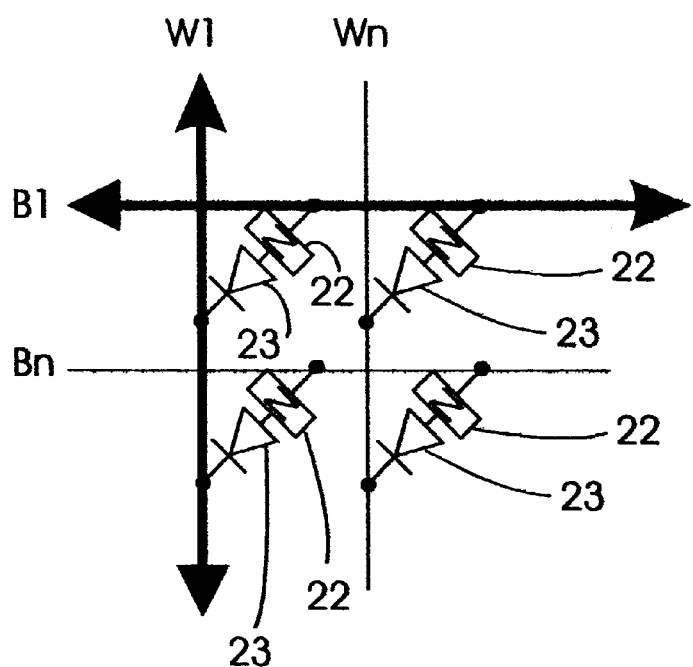
FIG. 2B is a schematic block diagram depicting a write operation for a conventional MRAM having an MTJ-diode combination per cell.
Figure 2C:
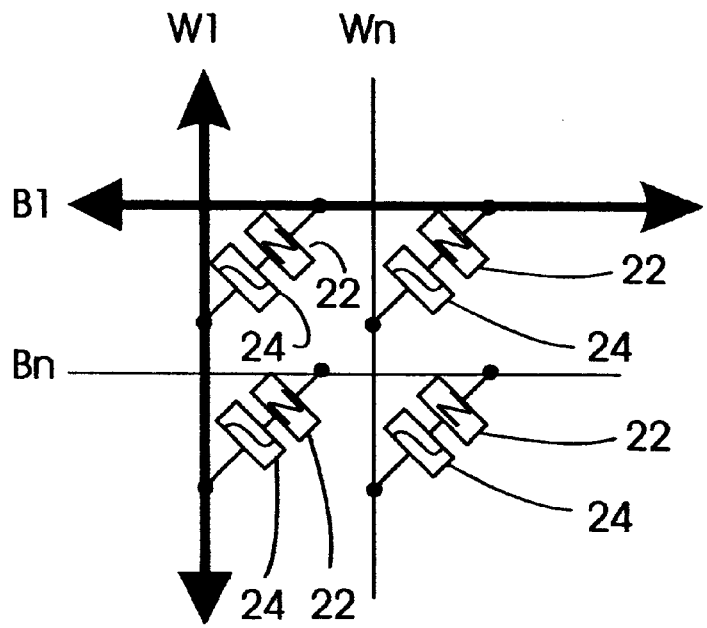
FIG. 2C is a schematic block diagram depicting a write operation for a conventional MRAM having an MTJ-NLE combination per cell.
Figure 2D:
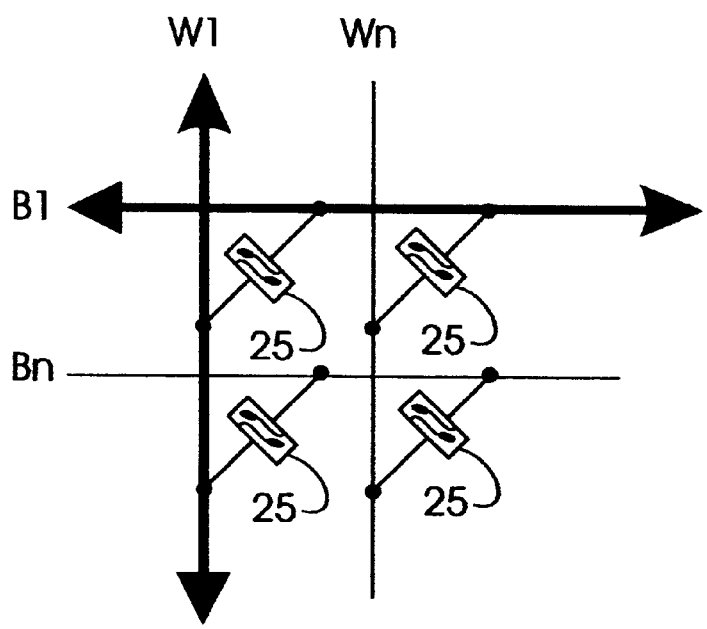
FIG. 2D is a schematic block diagram depicting a write operation for a conventional MRAM having a non-linear MTJ per cell.
Figure 3A:
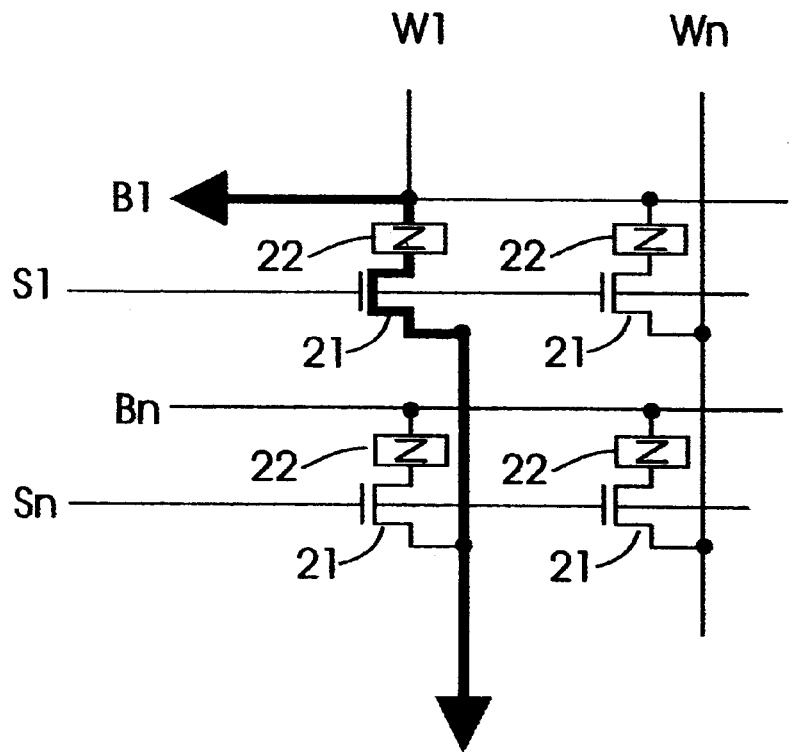
FIG. 3A is a schematic block diagram depicting a write operation for an MRAM having an MTJ-FET combination per cell according to the present invention.
Figure 3B:
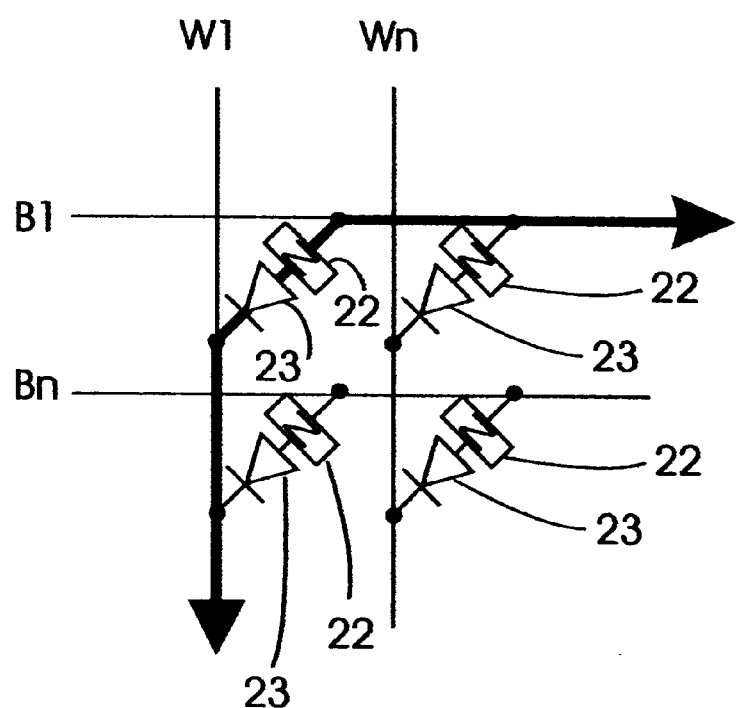
FIG. 3B is a schematic block diagram depicting a write operation of an MRAM having an MTJ-diode combination per cell according to the present invention.
Figure 3C:
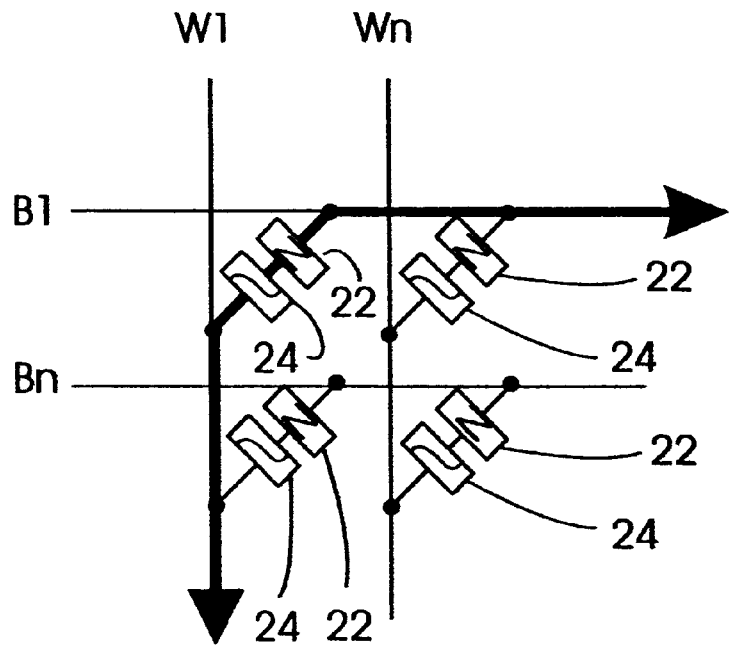
FIG. 3C is a schematic block diagram depicting a write operation of an MRAM having an MTJ-NLE combination per cell according to the present invention.
Figure 3D:
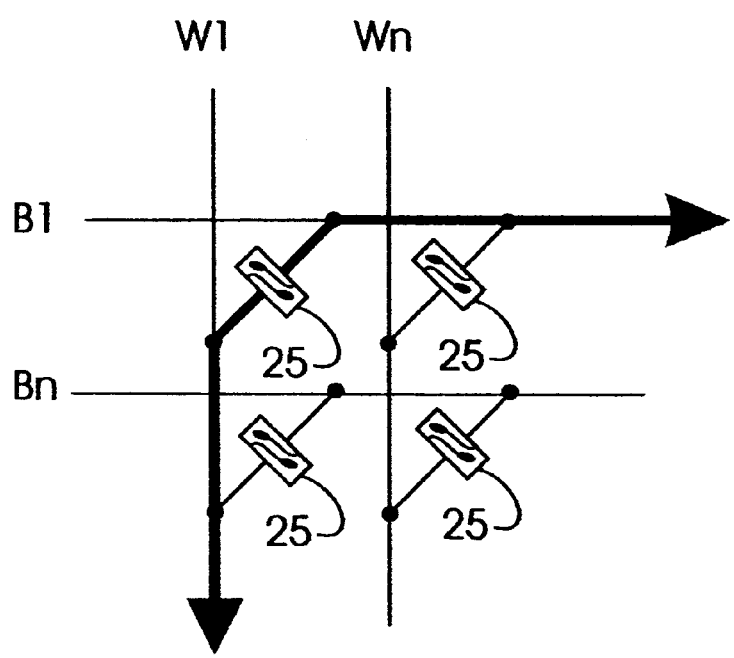
FIG. 3D is a schematic block diagram depicting a write operation for an MRAM having a non-linear MTJ per cell according to the present invention.
Figure 4A:
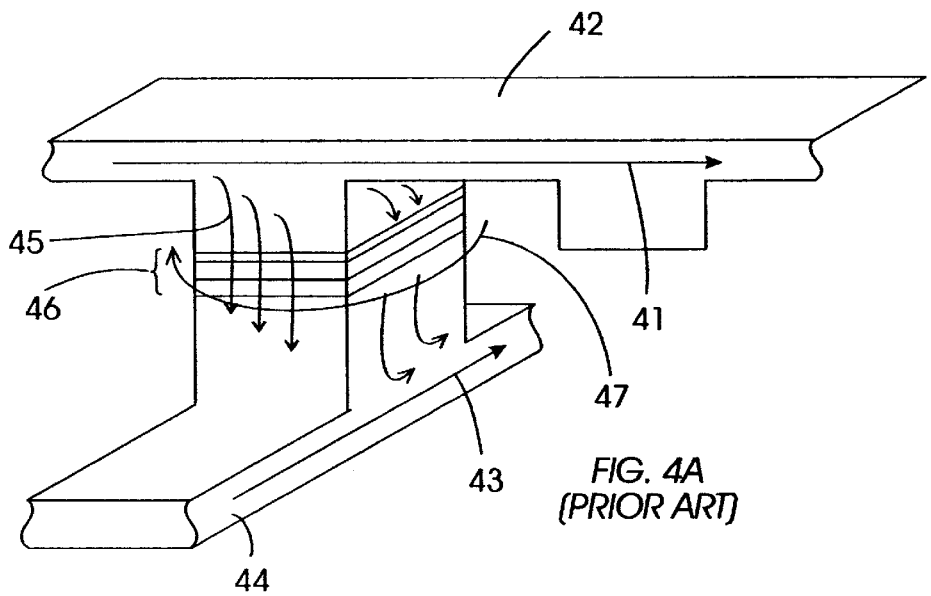
FIGS. 4A–4C depict graphical representations of a current flowing through a conventional MTJ device.
Figure 4B:
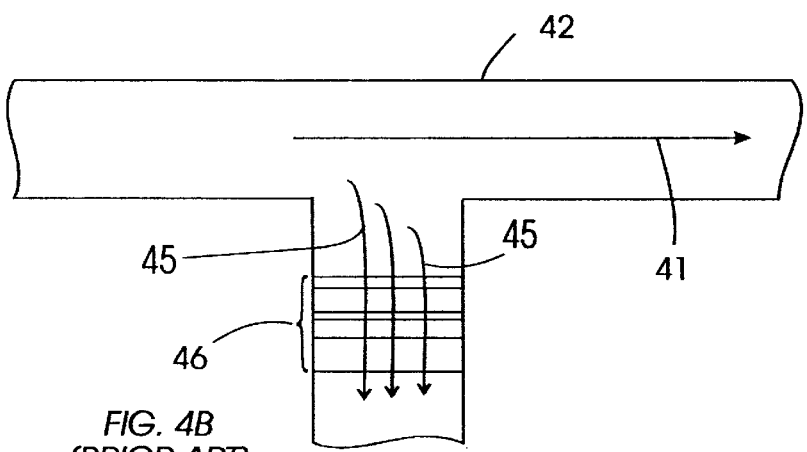
Figure 4C:
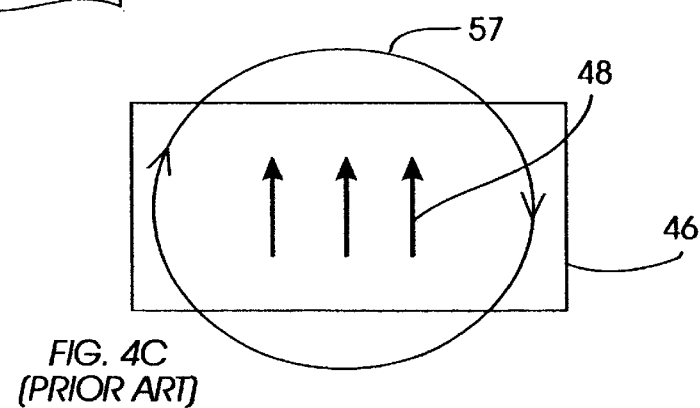

To illustrate the present invention, current flow through a conventional MTJ device is first considered. FIGS. 4A–4C show graphical representations of a current flowing through a conventional MTJ device. In FIG. 4A, a current 41 is shown flowing in a bit line 42, while a current 43 is shown flowing in a word line 44. A current 45 flows from bit line 42 through MJT device 46. FIG. 4B shows a cross sectional side view of current 45 flowing from bit line 42 through MTJ device 46. Current 45 generates a self-field 47, shown in FIG. 4A. Self-field 47 is oriented circumferentially around MTJ 46. For conventional anisotropic MTJs in which the magnetization within the ferromagnetic electrodes is predominantly aligned in one direction (48 in FIG. 4C), the self-field does not aid in switching the MTJ device.

Figure 5A:
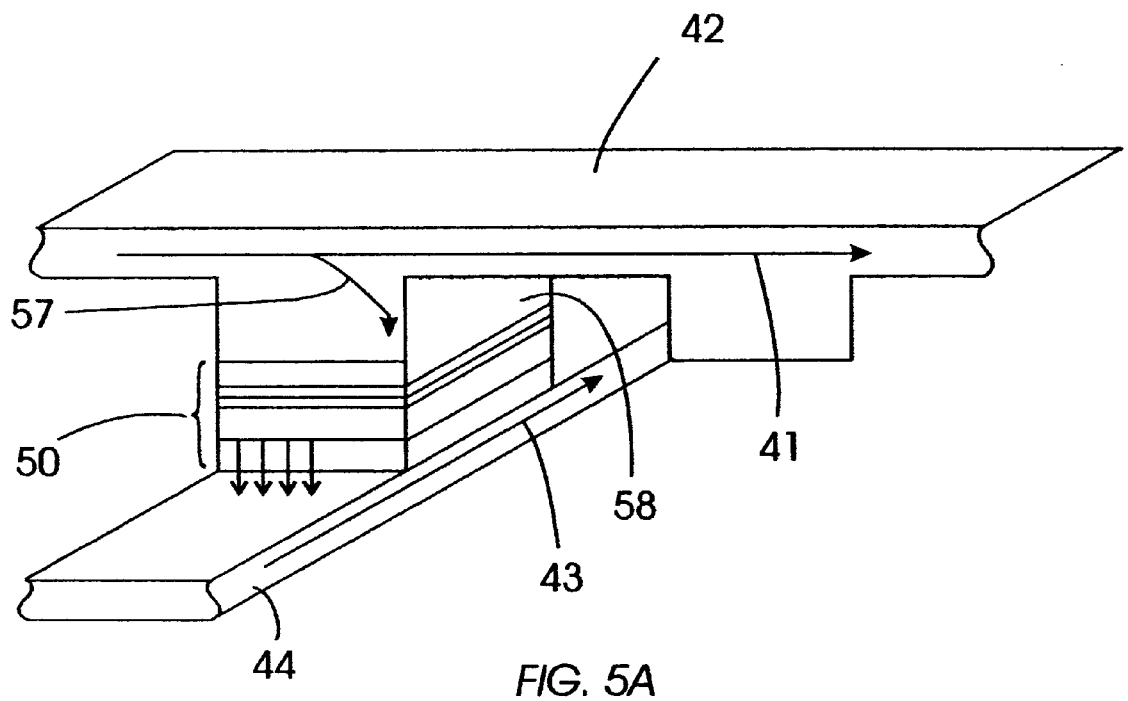
FIGS. 5A and 5B show a first embodiment of the present invention for passing write current through an MTJ device.
Figure 5B:
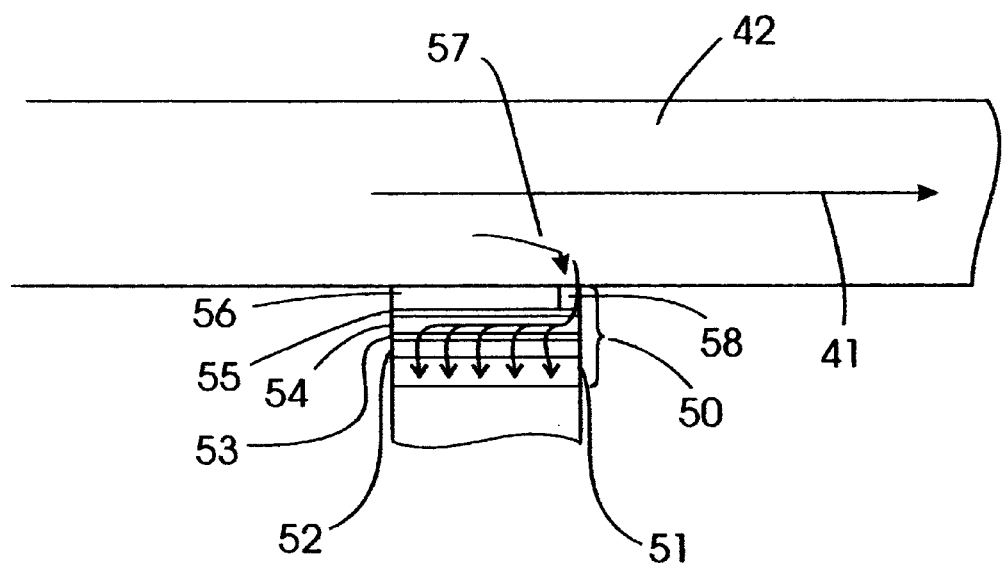

FIGS. 5A and 5B show a first embodiment of the present invention for passing a write current through a non-circularly shaped anisotropic MTJ device. In FIGS. 5A and 5B, an anisotropic MTJ device 50 is formed having a lower pinned ferromagnetic electrode 51, a tunnel junction 52, a first free ferromagnetic layer 53, a highly conducting layer (Cu) 54, a second free ferromagnetic layer 55 and a thick insulating layer 56. A highly conducting material 58, such as Cu, is formed near an edge of MTJ device 50 between bit line 42 and highly conducting layer 54.

Figure 6A:
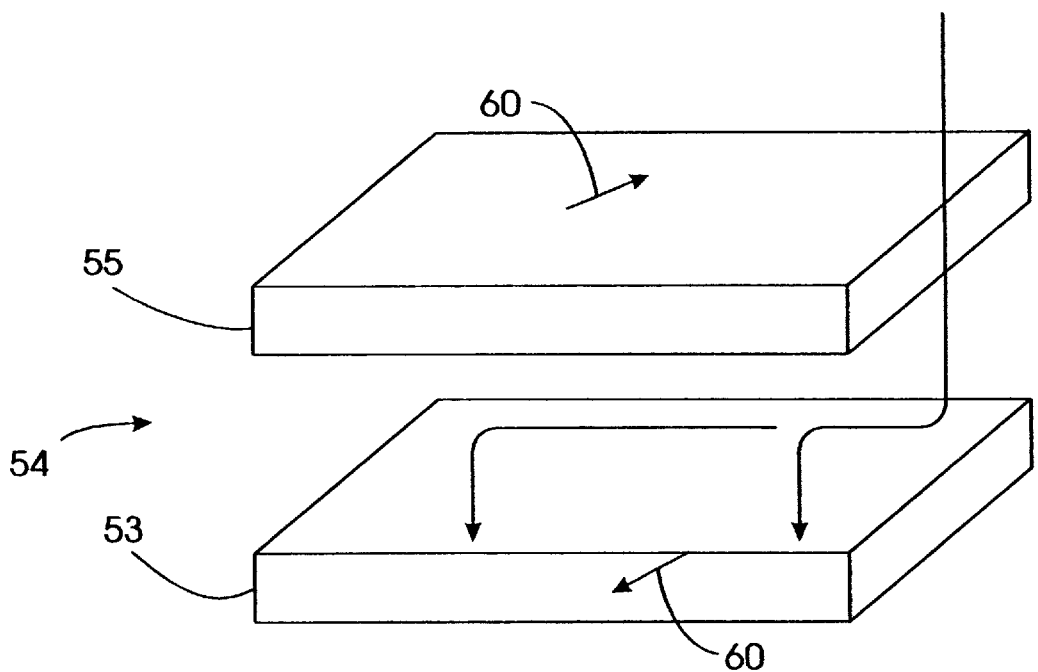
FIGS. 6A and 6B show a perspective view of upper and lower free ferromagnetic layers of an MTJ device.
Figure 6B:
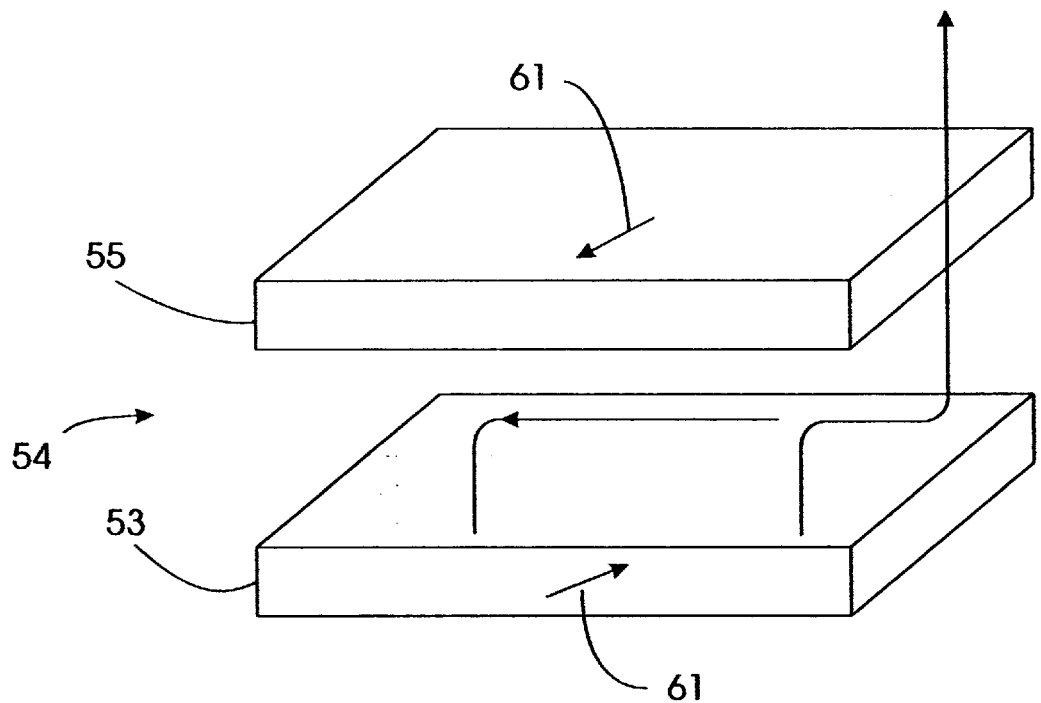

When a write current 57 flows into MTJ device 50 from bit line 42, the write current flows into highly conducting material 58 to highly conducting layer 54. Write current 57 then flows horizontally in layer 54 in between layers 53 and 55, generating a magnetic field, as indicated by arrows 60 shown in FIGS. 6A. FIGS. 6 and 6B show a more detailed perspective of the lower free ferromagnetic layer 53 and its magnetostatically-coupled free ferromagnetic layer partner 55. The orientation of magnetic field 60 depends on the direction of current 57. When current flows from right to left in FIG. 6A, the field generated is oriented along the easy axis, as shown by arrows 60 in FIG. 6A. When current flows from left to right in FIG. 6B, the magnetic field is generated is the opposite direction oriented along the easy axis shown by arrows 61.

The flux closure of layers 53 and 55 can be perfect, yet still allow switching of layers 53 and 55 by passage of a write current because the switching field is generated by a current that flows in between layers 53 and 55, and not outside the layers. An advantageous consequence is that for such a flux-closed system, disturbances from exterior fields, such as from other word or bit lines, is negligible because the net moment of each flux-closed free layer is small. Also, the disturbance by fields generated by other sources is similarly reduced. Moreover, the required shielding of the entire memory device can be minimized.

When using a partially flux-closed ferromagnetic structure, an additional current 41 can flow in bit line 42 and/or an additional current 43 can flow in word line 44 alone or in combination to assist in switching.

Although the first embodiment of the present invention of passing a current through an anisotropic MTJ element has been described with respect to a flux-closed free layer structure, the same advantage with regard to improved write selectivity is also obtained for anisotropic MTJs having simple free layers.

The maximum write current through an MTJ device is limited by the resistance and breakdown voltage of the MTJ device. The write current may also be limited by the properties of the selection device. A realistic value of the write current through an MTJ-FET, MIM-MBM or non-linear MTJ is approximately 1 mA for a $0.2 \times 0.4 \ \mu m^2$ device, assuming a MTJ resistance of 1 k$\Omega$ and a voltage of 1 Volt.

Figure 7A:
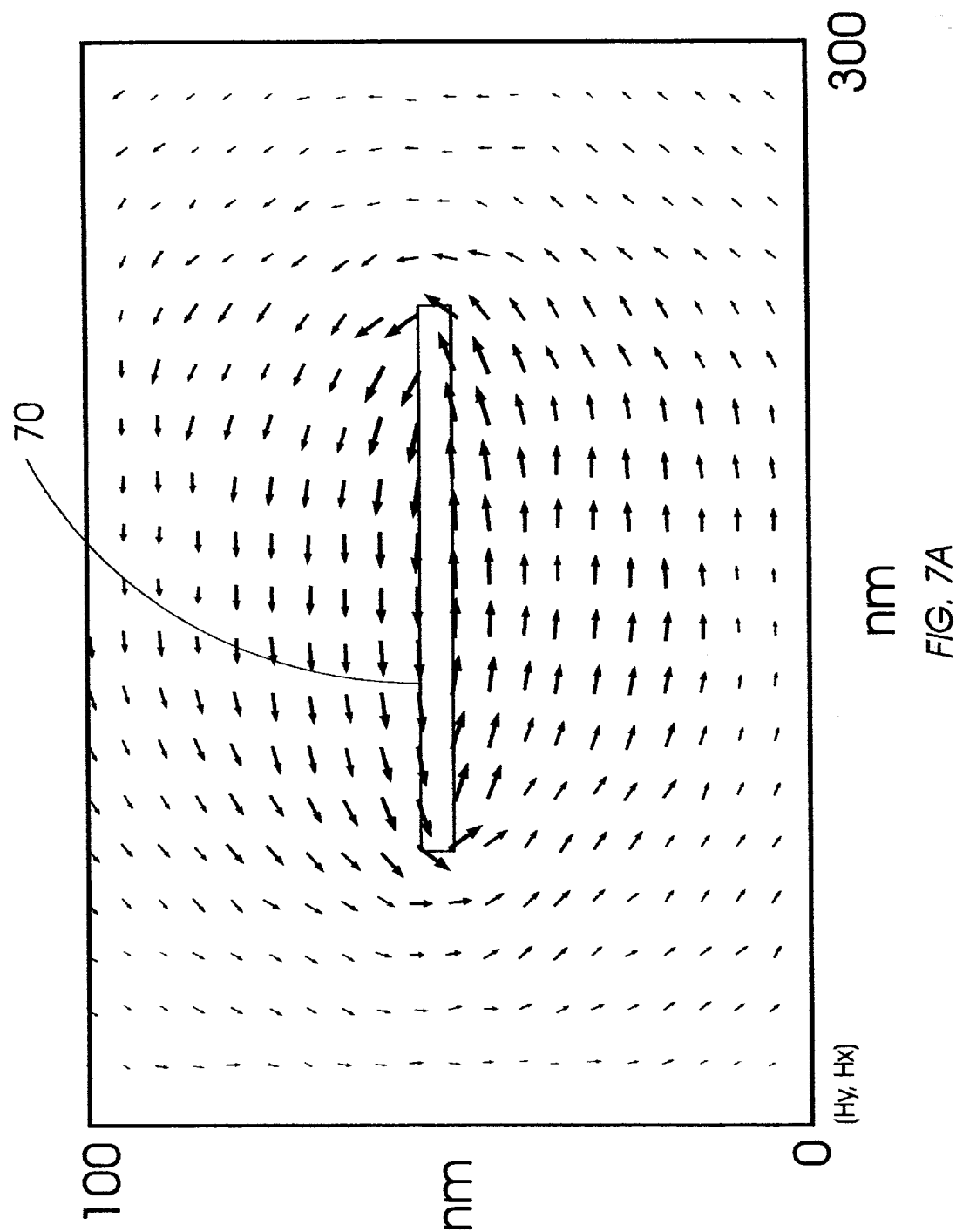
FIG. 7A shows a cross sectional view of a 100 Å thick Cu film with 1 mA current passing through it and the resulting magnetic field vectors.

FIG. 7A shows a cross sectional view of a 100 Å Cu layer 70 through which a current of 1 mA flows (out of the plane of the paper). Layer 70 corresponds to layer 54 in FIG. 5B and, thus, would be surrounded on adjacent sides (top and bottom in FIG. 7A) by two ferromagnetic layers that are each, for example, a 50 Å thick permalloy (NiFe) layer, and that are not shown in FIG. 7A. In the device shown in FIG. 5B, current will be conducted from layer 54 down through layers 53, 52 and 51, and in particular, through tunneling layer 52. Because the resistance of layer 54 is small compared to the resistance of tunneling layer 52, the current flowing through layer 54 laterally (i.e., in a direction parallel to layer 54) will decrease along the lateral length of layer 54 from the right to the left in FIG. 5B. Thus, in FIG. 7A, the current through layer 70 is allowed to decrease linearly along the length of layer 70. Consequently, the current flowing through layer 70 is 1 mA at one end of this layer and zero at the other end.

Figure 7B:
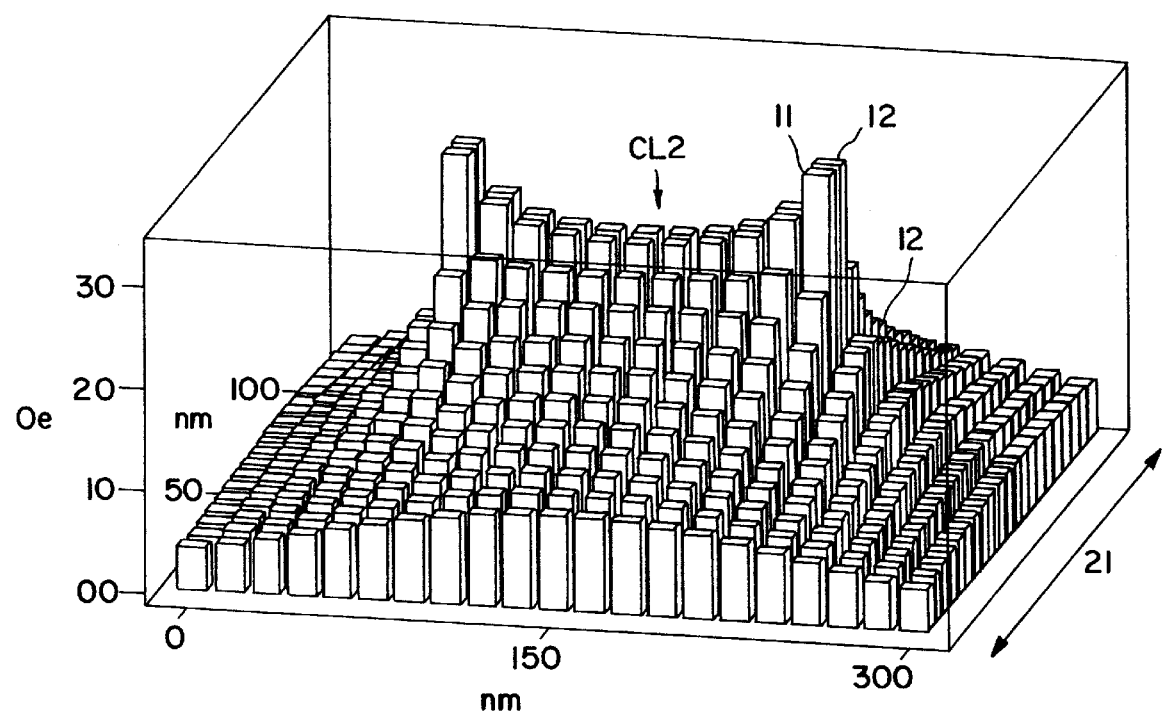
FIG. 7B shows a three dimensional plot of the absolute values of the magnetic vectors shown in FIG. 7A.

The arrows shown in FIG. 7A represent the magnetic field vectors generated by a write current passing through layer 70. FIG. 7A shows a view of the cell from the side where the write current flows into the edge of the device, with the direction of the write current being out of FIG. 7A. The rectangular shape in the middle is a cross sectional view of a 200 nm×600 nm×10 nm Cu inner layer 70. As can be seen from FIG. 7A, the magnetic field is oriented elliptically around the center Cu conductor, and is well oriented with regard to switching of the magnetization in the adjacent magnetic films. The stray field further away from the cell is also shown. FIG. 7B shows a plot of the absolute values of the arrows in FIG. 7A representing the magnetic field vectors. The magnitude of the effective field in the magnetic NiFe layers is approximately 25 Oe, which is larger than the expected switching field of the flux-closed pair of magnetic films, thus enabling switching of the flux-closed pair.

Figure 8:
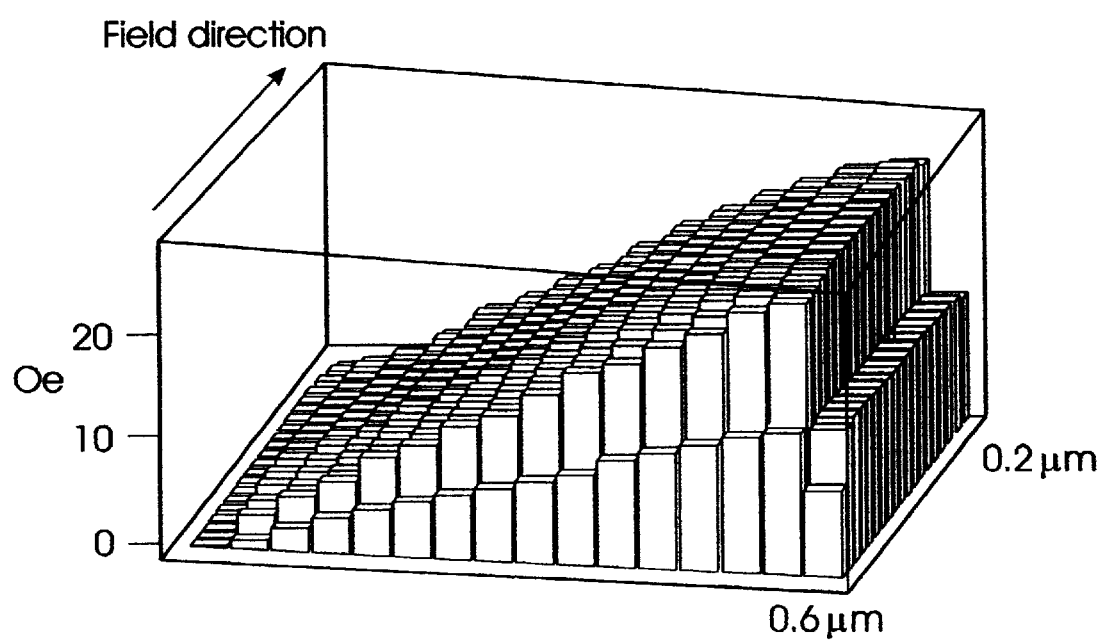
FIG. 8 shows a plot of the field variation directly above the inner conductor as a function of lateral position across the MTJ cell of FIG. 5.
Figure 9:
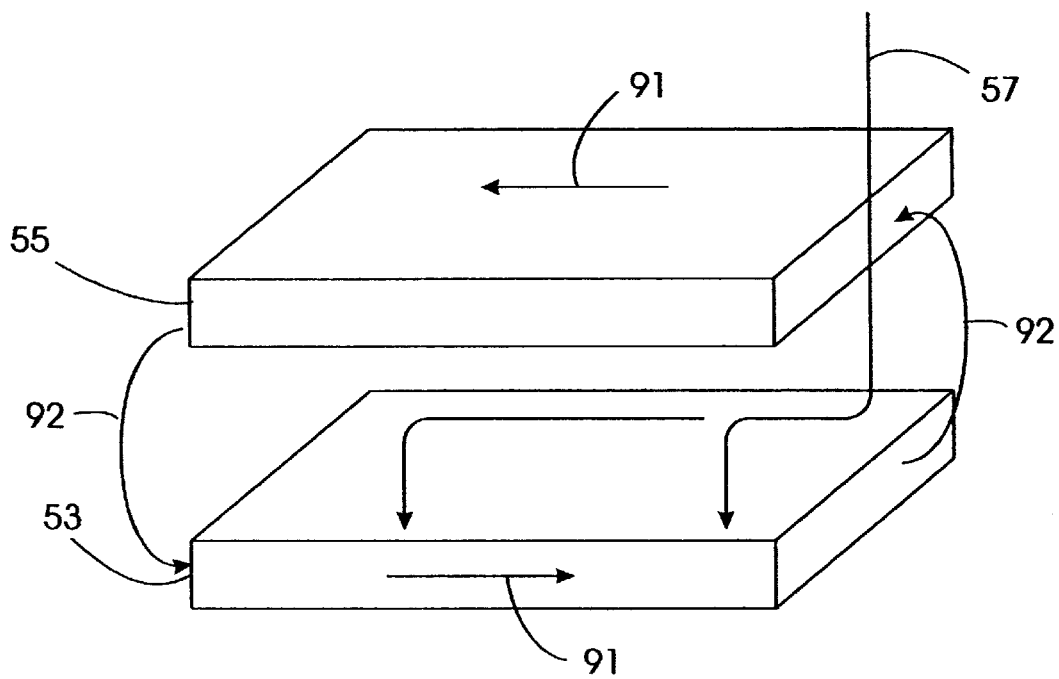
FIG. 9 shows a perspective view of upper and a lower free-ferromagnetic layers of a flux-closed MTJ device during rotation.

FIG. 8 shows a plot of the field variation as a function of lateral position across the cell, directly above the inner conductor where the upper magnetic free layer is located. The current flows into the NiFe/Cu/NiFe sandwich from the right side of FIG. 8 corresponding to current flowing from conducting material 58 into layers 53, 54 and 55 of FIG. 5B. The point where the current flows into the cell is at the right-most side of the plot of FIG. 8. As can be seen in FIG. 8, the field is highest close to the edge contact where the current flows in. The field is smallest at the left-hand side, where most of the current has already entered the MTJ. Although the field is not uniform, the field switches the magnetic films completely, because, if the field switches only the right-hand side of the cell, a domain wall would be present in the two films, which is energetically unfavorable. The flux closure of the films is not limited to the easy axis field during rotation of the magnetization. The magnetization 91 may be perpendicular to the easy axis and is still flux-closed, as indicated by arrows 92 in FIG. 9. Thus, during rotation, no demagnetizing fields are present. Consequently, the switching field can be very low.

The first preferred embodiment of the present invention described above includes a completely flux-closed free layer. A flux-closed free layer has many advantages over a non-flux-closed free layer. In addition to the advantages described above, namely the weakened magnetic interaction between neighboring MTJ memory cells and the weakened magnetostatic interaction between the free layer and the pinned layer in a given memory cell, a flux-closed free layer also allows smaller memory cells than would otherwise be allowed because of the superparamagnetic limit. That is, when the volume of magnetic material in the free layer becomes too small and, consequently, magnetic anisotropy of the free layer is too small, thermal fluctuations can cause the magnetic moment of the free layer to rotate spontaneously (i.e., the superparamagnetic limit). By using a flux-closed free layer, a greater volume of magnetic material can be incorporated into the free layer than would otherwise be possible.

A magnetic tunnel junction memory cell having a partially flux-closed free layer comprised of two ferromagnetic layers separated by a thin antiferromagnetically coupling layer is discussed in U.S. Pat. No. 5,966,012 to S. S. P. Parkin. A magnetic tunnel junction memory storage cell having a flux-closed free layer comprised of two ferromagnetic layers separated by an electrically conducting layer, which does not direct magnetically couple these layers, is described in U.S. patent application Ser. No. 09/390,596, invented by S. S. P. Parkin et al., entitled Magnetic Memory Array With Magnetic Tunnel Junction Memory Cells Having Flux-Closed Free Layers, and filed Sep. 3, 1999.

For the present invention, it may be advantageous to use a partially flux-closed free layer, particularly when the magnetic field arising from the current through the MTJ device is not sufficient to rotate the magnetic moment of the free layer and a second magnetic field arising from a current or currents flowing through the word and/or bit lines are also needed. In this case, a partially flux-closed free layer may be used in which the magnetic moments of layers 53 and 55 in FIG. 5B are not exactly the same. The thicknesses and magnetization values for layers 53 and 55 are chosen so that the magnetic moments of layers 53 and 55 prefer to be aligned anti-parallel to one another in the absence of any field stimulus to the memory cell. The two states of the memory cell correspond to which direction the moment of layer 53 is oriented relative to the moment direction of the pinned FM layer 51. By varying the ratio of the thicknesses and magnetization values of layers 53 and 55, it is possible to ensure that these layers always remain largely anti-parallel to one another and thereby will only weakly interact with neighboring memory cells, as discussed in U.S. patent application Ser. No. 09/930,596, invented by S. S. P. Parkin et al., entitled Magnetic Memory Array With Magnetic Tunnel Junction Memory Cells Having Flux-Closed Free Layers, and filed Sep. 3, 1999. A second magnetic field can then act to aid the rotation of the magnetic moment of the partially flux-closed free layer. The current flowing through the device in a partially flux-closed embodiment flows in between the two magnetically coupled layers and initiates switching. Because there is a net magnetic moment of the partially flux-closed layers, an external field from either the word or bit line, or both may assist switching of the films. Although this decreases the selectivity because many other cells along either the word or bit line also experience the external field generated by the current in the word or bit line, the external field increases the total switching field for the selected cell. In the situation when the switching field of the current through the MTJ device is not sufficiently large by itself for switching, such an external field may assist in switching. In other words, the internal field may assist in switching the external field, thereby improving write selectivity with respect to MRAM cells not having a write current through the MTJ device.

As alternative configuration of the first embodiment, the two flux-closed free layers may be magnetically connected along their edges parallel to the current flow in the copper conductor using magnetic sidewalls to further improve magnetic flux closure.

Often small magnetic elements do not behave as single magnetic domains, but form inhomogeneous magnetic structures. See, for example, Shi et al., Magnetization vortices and anomalous switching in patterned NiFeCo submicron arrays, Appl. Phys. Lett. 74, 2525 (1999). Shi et al. disclose that magnetic vortices can readily be trapped in the interior of small rectangular (or square) elements so that the magnetization in zero field is not uniform, but rather can take up two different topological forms. In one form, the vortices are trapped near two corners on the same side of the element. In another form, two vortices are trapped at two opposite corners of the element. Very large fields are required to expel the trapped vortices from the element once the vortices are formed. For limited field excursions, such as those likely to be applied in an MRAM for switching the magnetic state of an MTJ device, the vortices remain trapped and move within the MTJ device while maintaining the same topological form during the switching of the magnetization of the device.

The formation of trapped vortices is highly likely, but does not substantially change the net magnetic moment of the device so that the MR of, for example, an MTJ MRAM memory cell, will not be significantly reduced by the presence of such vortices. Rather, the most important effect of such vortices is to change the switching field of the device. As discussed by Shi et al., the switching field of nominally identical elements within an array of elements is likely to take up one of two values depending on the topological form of the vortex structure within each element. Thus, the vortex structure leads to a significant variation in magnetic switching fields between cells making it impossible to control the switching of the elements.

Nevertheless, the write current passed through an anisotropic MTJ device during the writing of the device causes a more symmetric vortex structure to be stabilized over a less symmetric structure because of the presence of the circumferential self-field generated by the write current. Thus, MTJ elements of an are more similar with regard to their magnetic switching fields.

It is possible to take advantage of the formation of vortices formed in small magnetic elements by tailoring the shape of these elements to favor the formation of a vortex state. In a second embodiment of the present invention, the MTJ device may be formed to be a completely isotropic MTJ element in which there is no preferred orientation of the magnetization of the element, either due to shape or due to some intrinsic magnetocrystalline anisotropy. Thus, the MTJ element is approximately circular in shape and the magnetic properties of the element are chosen so that the magnetization forms a vortex in both ferromagnetic layers forming the MTJ. As discussed by, for example, Cowburn et al., Single-Domain Circular Nanomagnets, Physical Review Letters, volume 83, page 1042, 1999, small circular magnetic elements formed from single ferromagnetic thin films are likely to form vortex ground states provided that the elements are neither too thin nor too small. It is well known that magnetic vortices are highly stable magnetic structures because they are flux-closed. Typically, large magnetic fields are required to reverse their magnetic state. For example, Cowburn et al. show that fields of several hundred Oersted are required for changing the magnetic state of sub-micron-sized elements formed from very soft magnetic films of supermalloy of ~6–15 nm thick. In the present invention, the magnetization of an isotropic MTJ element can be switched by passing current through the MTJ cell.

Figure 10:
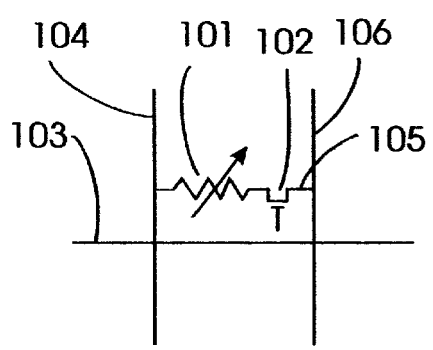
FIG. 10 shows a schematic diagram of an MRAM cell having an MTJ element connected in series with an FET switch.

For the purposes of illustration of the second embodiment of the present invention, consider an isotropic, approximately round MTJ cell having a first ferromagnetic layer FM1 and a second magnetically soft FM layer FM2. A tunnel barrier separates first layer FM1 and second layer FM2. FIG. 10 shows a schematic diagram of an MTJ element 101 connected in series with an FET switch 102. A select line 103 that also acts as a word line controls FET switch 102. Switch 102 is used for allowing current to flow through the MTJ device both for reading and writing the MTJ device. An array of similar MTJ cells is formed to create a MRAM. The MTJ cells are placed at the intersection of the select lines and a second series of access (or sense) lines 104. Each MTJ cell 101 is connected to one of the access lines 104 and the corresponding series switch 102 is connected to one of the select lines 103, such as shown in FIG. 10. The third terminal 105 of switch 102 is connected to a reference potential, such as a ground connection, for reading and writing, and can be connected in various ways. In a preferably, terminal 105 is connected to one of a set of column lines 106 that is parallel to sense lines 104.

Figures 11A, 11B:
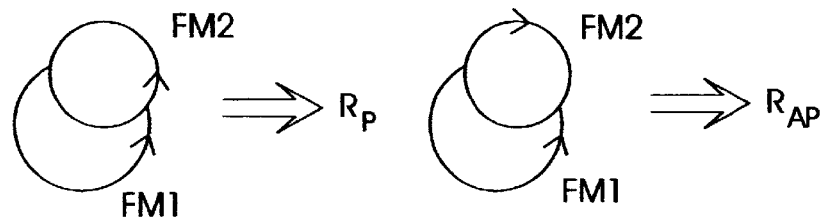
FIGS. 11A and 11B respectively depict the low and high resistance states of an MTJ memory cell having vortex magnetization distributions in the ferromagnetic layers.

FIGS. 11A and 11B respectively depict the low and high resistance states of an MTJ memory cell having vortex magnetization distributions in the ferromagnetic layers. The magnetization vortex in layer FM1 has the same handedness in both the high- and low-resistance states of the MTJ cell. The handedness of layer FM2 is the same as that of FM1 in the low-resistance state $R_p$ (FIG. 11 A) and is opposite to FM2 in the high-resistance state $R_{AP}$ (FIG. 11B).

In order to store information in the memory cell, layer FM1 must first be set to a particular vortex state by raising the potential of select line 103 and passing a set current $I_{set}$ through access line 104 that returns through column line 106. The setting of layer FM1 is done possibly only once in the operation of the memory cell. Later in normal operation, in order to write data into the cell select line 103 is raised and a write current $\pm I_W$ is passed through access line 104 and the selected cell. Ferromagnetic layer FM1 is chosen to have a greater coercivity than that of FM2, for example, by varying the composition of FM1 and FM2, so that write current $I_W$ is less than $I_{set}$ and does not change the vortex state of FM1.

Either a positive or negative direction for $I_W$ is chosen to write either a zero or one state, respectively. If the zero state is written, the vortex pattern of magnetization in layers FM1 and FM2 will both have the same handedness and the value of the tunnel junction resistance will be its lower value $R_p$. If the one state is written, the vortices in layers FM1 and FM2 will not be parallel and the value of the tunnel resistance will be large $R_{ap}$. To read the cell, select line 103 is raised and a read current $I_r$ is passed through access line 104 and the cell for detecting the value of the tunnel junction resistance.

Figure 12A:
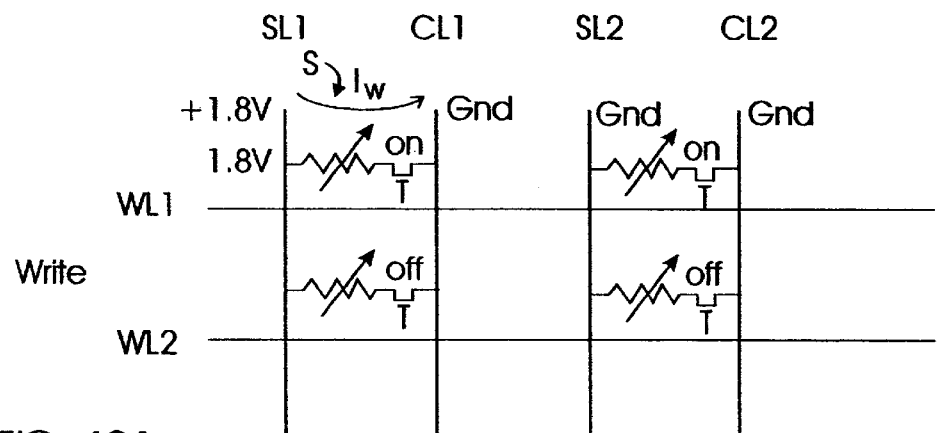
FIG. 12 shows a schematic diagram of a plurality of MTJ cells in an MRAM array.
Figure 12B:
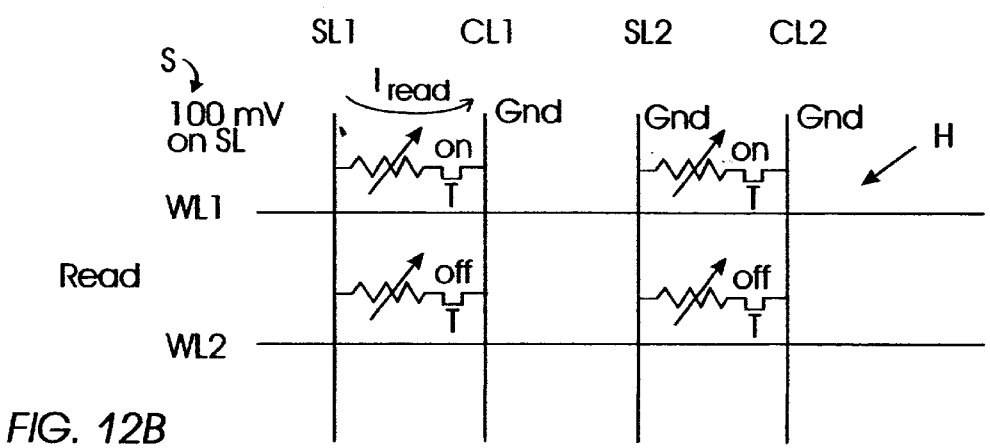
Figure 13:
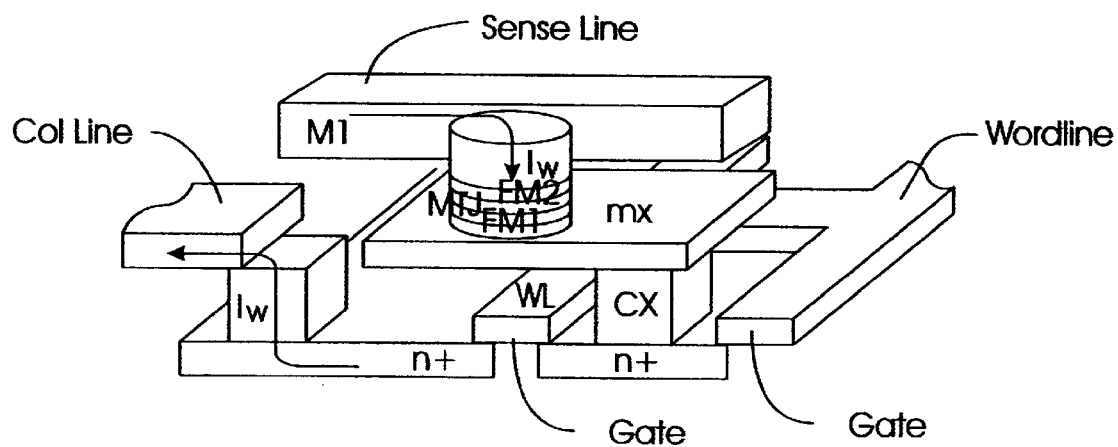
FIG. 13 shows a perspective view of a second embodiment of an MTJ cell according to the present invention.

Applying these operations to unique cells in an array is possible by the choice of the select line and access line connected to a selected cell S, as illustrated in FIGS. 12A, 12B and 13. Select line WL1 is raised to about +1.8 V, but other select lines, such as WL2, stay at ground so no currents pass through unselected cells, such as cell F (FIG. 12B). To select a single cell S for writing (FIG. 12A) or reading (FIG. 12B), a current Iw or Ir, respectively, is passed through a selected access line SL1, the selected cell S1 and the selected column line CL1. No currents are passed through unselected lines SL2 and CL2, so no current flows through unselected cell H. It is possible, if desired, to select both S and H cells for writing in the same operation, in which case separate currents are be passed through SL2 and CL2. It is necessary that each cell switch be a bi-directionally conducting device, such as a field effect transistor, because both plus and minus current Iw are required to write states zero and one.

For both anisotropic and isotropic MTJ MRAM cells in which writing of the cells is accomplished solely by passing current through the cell without the aid of any additional current through the write (access) and bit (sense) lines, the write and bit lines placement can be relaxed as compared to conventional MRAMs. In conventional MRAMs, the crosspoint of the write and bit lines must be spaced as closely as possible to the MTJ for maximizing the write field obtained from current passed through the lines and for localizing the field at the selected MTJ. Similarly, in conventional MRAMs, the alignment of the write and bit lines with regard to the MTJ is important. In contrast, the present invention can write an MTJ device by only using current passing through the MTJ device. Consequently, the spacing of the write and bit lines from the MTJ cells can be increased to reduce the magnetic field to which the MTJ devices are subjected to from currents passing along the write and bit lines. Under these circumstances, the placement of the write and bit lines is also less stringent. By relaxing the requirements on the position and placement of the write and bit lines, the MRAM of the present invention is more easily fabricated than conventional MRAMs.

While the present invention has been described in connection with the illustrated embodiments, it will be appreciated and understood that modifications may be made without departing from the true spirit and scope of the invention.

What is claimed is:

1. A non-volatile memory cell, comprising:
  a first free ferromagnetic layer;
  a second free ferromagnetic layer; the second ferromagnetic layer extending in a direction that is substantially parallel to the first ferromagnetic layer, the first and second ferromagnetic layers having a first predetermined magnetization; and
  a highly conductive layer formed between the first ferromagnetic layer and the second ferromagnetic layer,
  a write current flowing into the highly-conductive layer and along at least a portion of the highly-conductive layer producing a self-field associated that changes the first predetermined magnetization of the first and second ferromagnetic layers to a second predetermined magnetization.

2. The non-volatile memory cell according to claim 1, wherein the non-volatile memory cell is an anisotropic magnetic tunnel junction device.

3. The non-volatile memory cell according to claim 1, wherein the non-volatile memory cell is an isotropic magnetic tunnel junction device.

4. The non-volatile memory cell according to claim 1, further comprising a selection device connected in series with the memory cell.

5. The non-volatile memory cell according to claim 4, wherein the selection device is a diode.

6. The non-volatile memory cell according to claim 4, wherein the selection device is a bi-directional conducting device.

7. The non-volatile memory cell according to claim 6, wherein the bi-directional conducting device is a field effect transistor.

8. The non-volatile memory cell according to claim 6, wherein the bi-directional conducting device is a non-magnetic tunnel junction device.

9. The non-volatile memory cell according to claim 6, wherein the selection device is a non-linear element.

10. The non-volatile memory cell according to claim 9, wherein the non-linear element is a metal-insulator-metal device.

11. The non-volatile memory cell according to claim 9, wherein the non-linear element is a metal-semiconductor-metal device.

12. The non-volatile memory cell according to claim 1, wherein the first and second ferromagnetic layers are part of a strongly non-linear magnetic tunnel junction device.

13. The non-volatile memory cell according to claim 1, wherein the first and second ferromagnetic layers form a flux-closed structure.

14. The non-volatile memory cell according to claim 13, wherein the self-field produced by the write current provides a magnetic field in each of the first and second ferromagnetic layers, and
  wherein the magnetic field in the first ferromagnetic layer has a direction that is opposite to a direction of the magnetic field in the second ferromagnetic layer.

15. The non-volatile memory cell according to claim 1, wherein the first and second ferromagnetic layers form a partially flux-closed structure.

16. The non-volatile memory cell according to claim 15, wherein the self-field produced by the write current provides a magnetic field in each of the first and second ferromagnetic layers, and
  wherein the magnetic field in the first ferromagnetic layer has a direction that is opposite to a direction of the magnetic field in the second ferromagnetic layer.

17. The non-volatile memory cell according to claim 1, wherein the write current changes the first predetermined magnetization of the first and second ferromagnetic layers to the second predetermined magnetization by assisting the changing of the magnetization.

18. A non-volatile memory array, comprising:
  a substrate having a surface;
  a first plurality of substantially parallel electrically conductive lines formed on the surface of the substrate;
  a second plurality of substantially parallel electrically conductive lines formed on the substrate, the second plurality of lines being oriented generally perpendicular to the first plurality of lines and overlapping the first plurality of lines, the second set of lines being spaced from the first set of lines in a direction generally perpendicular from surface of the substrate to define a plurality of intersection regions, an intersection region being located at a corresponding overlap of a first line and a second line;

a plurality of memory cells, a memory cell being located in an intersection region between the first and second lines and being electrically connected to the first line and the second line defining the intersection region, each memory cell including a first free ferromagnetic layer, a second free ferromagnetic layer and a highly-conductive layer, the first ferromagnetic layer of each memory cell extending in a direction that is substantially parallel to the second ferromagnetic layer, the first and second ferromagnetic layers having a first predetermined magnetization, the highly-conductive layer of each memory cell being formed between the first ferromagnetic layer and the second ferromagnetic layer of the memory cell, a write current flowing between the first line and the second line through each selected memory cell flowing into the highly-conductive layer and along at least a portion of the highly-conductive layer, a self-field associated with the write current changing the first predetermined magnetization of the first and second ferromagnetic layers to a second predetermined magnetization.

19. The non-volatile memory array according to claim 18, wherein each memory cell is an anisotropic magnetic tunnel junction device.

20. The non-volatile memory array according to claim 18, wherein each memory cell is an isotropic magnetic tunnel junction device.

21. The non-volatile memory array according to claim 18, wherein each memory cell further includes a selection device connected in series with the memory cell.

22. The non-volatile memory array according to claim 21, wherein the selection device is a diode.

23. The non-volatile memory array according to claim 21, wherein each selection device is a bi-directional conducting device.

24. The non-volatile memory array according to claim 23, wherein each bi-directional conducting device is a field effect transistor.

25. The non-volatile memory array according to claim 23, wherein each bi-directional conducting device is a non-magnetic tunnel junction device.

26. The non-volatile memory array according to claim 23, wherein the selection device is a non-linear element.

27. The non-volatile memory array according to claim 26, wherein the non-linear element is a metal-insulator-metal device.

28. The non-volatile memory array according to claim 26, wherein the non-linear element is a metal-semiconductor-metal device.

29. The non-volatile memory array according to claim 18, wherein the memory cell is a strongly non-linear magnetic tunnel junction device.

30. The non-volatile memory array according to claim 18, wherein the first and second ferromagnetic layers of each memory cell form a flux-closed structure.

31. The non-volatile memory array according to claim 30, wherein the self-field associated with the write current provides a magnetic field in each of the first and second ferromagnetic layers, and wherein the magnetic field in the first ferromagnetic layer has a direction that is opposite to a direction of the magnetic field in the second ferromagnetic layer.

32. The non-volatile memory array according to claim 18, wherein the first and second ferromagnetic layers of each memory cell form a partially flux-closed structure.

33. The non-volatile memory array according to claim 32, wherein the self-field associated with the write current provides a magnetic field in each of the first and second ferromagnetic layers, and wherein the magnetic field in the first ferromagnetic layer has a direction that is opposite to a direction of the magnetic field in the second ferromagnetic layer.

34. The non-volatile memory array according to claim 18, wherein the write current changes the first predetermined magnetization of the first and second ferromagnetic layers to the second predetermined magnetization by assisting the changing of the magnetization.

35. The non-volatile memory array according to claim 34, wherein another current flows in one of the first lines and the second lines connected to each selected memory cell.

* * * * *